United States Patent
Tang et al.

(10) Patent No.: US 7,528,064 B2
(45) Date of Patent: May 5, 2009

(54) INTERCONNECT STRUCTURES WITH BOND-PADS AND METHODS OF FORMING BUMP SITES ON BOND-PADS

(75) Inventors: Sanh D. Tang, Boise, ID (US); Mark E. Tuttle, Boise, ID (US); Keith R. Cook, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/872,607

(22) Filed: Oct. 15, 2007

(65) Prior Publication Data

US 2008/0032494 A1 Feb. 7, 2008

Related U.S. Application Data

(63) Continuation of application No. 11/032,975, filed on Jan. 10, 2005, now Pat. No. 7,282,433.

(51) Int. Cl.
*H01L 21/4763* (2006.01)
(52) U.S. Cl. .................. 438/631; 438/626; 438/645
(58) Field of Classification Search .......... 438/626, 438/631, 645
See application file for complete search history.

(56) References Cited

U.S. PATENT DOCUMENTS

| | | | |
|---|---|---|---|
| 5,114,826 A * | 5/1992 | Kwong et al. ............ 430/192 |
| 5,702,977 A * | 12/1997 | Jang et al. ............... 216/38 |
| 5,736,456 A * | 4/1998 | Akram .................... 438/614 |
| 5,773,359 A | 6/1998 | Mitchell et al. |
| 6,107,180 A | 8/2000 | Munroe et al. |
| 6,130,141 A | 10/2000 | Degani et al. |
| 6,268,114 B1 | 7/2001 | Wen et al. |
| 6,294,471 B1 | 9/2001 | Tseng et al. |
| 6,429,511 B2 | 8/2002 | Ruby et al. |
| 6,441,487 B2 | 8/2002 | Elenius et al. |
| 6,451,681 B1 | 9/2002 | Greer |

(Continued)

FOREIGN PATENT DOCUMENTS

EP          0 949 672 A2       10/1999

OTHER PUBLICATIONS

International Search Report and Written Opinion for International Application No. PCT/US2006/000881, 10 pages, mailed May 22, 2006.

*Primary Examiner*—Thao X Le
*Assistant Examiner*—Ajay K. Arora
(74) *Attorney, Agent, or Firm*—Perkins Coie LLP

(57) ABSTRACT

Microelectronic workpieces that have bump sites over bond-pads and methods of fabricating such bump sites. One embodiment of such a workpiece, for example, includes a substrate having a plurality of microelectronic dies comprising integrated circuitry and bond-pads, such as copper bond-pads, electrically coupled to the integrated circuitry. The workpiece further includes (a) a dielectric structure having a plurality of openings with sidewalls projecting from corresponding bond-pads, and (b) a plurality of caps over corresponding bond-pads. The individual caps can include a discrete portion of a barrier layer attached to the bond-pads and the sidewalls of the openings, and a discrete portion of a cap layer on the barrier layer. The caps are electrically isolated from each other and self-aligned with corresponding bond-pads without forming a mask layer over the cap layer.

20 Claims, 5 Drawing Sheets

U.S. PATENT DOCUMENTS

| | | |
|---|---|---|
| 6,452,270 B1 | 9/2002 | Huang |
| 6,455,408 B1 | 9/2002 | Hwang et al. |
| 6,534,396 B1 | 3/2003 | Fahn et al. |
| 6,534,863 B2 | 3/2003 | Walker et al. |
| 6,770,958 B2 | 8/2004 | Wang et al. |
| 7,282,433 B2 | 10/2007 | Tang et al. |
| 2001/0008311 A1 | 7/2001 | Harada et al. |
| 2002/0047218 A1 | 4/2002 | Liu et al. |
| 2002/0086533 A1 | 7/2002 | Jang et al. |
| 2004/0157450 A1 | 8/2004 | Bojkov et al. |

* cited by examiner

INTERCONNECT STRUCTURES WITH BOND-PADS AND METHODS OF FORMING BUMP SITES ON BOND-PADS

CROSS-REFERANCE TO RELATED APPLICATION

This application is a continuation of U.S. patent application Ser. No. 11/032,975, filed Jan. 10, 2005, which is incorporated herein by reference in its entirety.

TECHNICAL FIELD

The present invention relates to interconnect structures with bond-pads, such as copper bond-pads, and methods of forming bump sites on bond-pads.

BACKGROUND

Semiconductor devices and other types of microelectronic devices have a die attached to a ceramic chip carrier, organic printed circuit board, lead frame, or other type of interposing structure. The microelectronic dies can be attached to interposing structures using Direct Chip Attach (DCA), flip-chip bonding, or wire-bonding to electrically connect the integrated circuitry in the dies to the wiring of the interposing structures. In typical DCA or flip-chip methods, very small bumps or balls of a conductive material (e.g., solder) are deposited onto the contacts of a die. The bumps are then connected to corresponding terminals on an interposing structure.

Copper is widely used for the wiring in semiconductor devices. For example, the wiring in the integrated circuitry of many high performance devices is composed of copper. The bond-pads of many microelectronic dies are also made from copper. One problem of copper bond-pads, however, is that copper easily oxidizes and corrodes in the presence of oxygen and water. As a result, copper bond-pads must be protected to prevent oxidation and/or corrosion that could possibly impair or destroy the device.

FIG. 1 is a cross-sectional view illustrating a portion of a microelectronic die 10 having substrate 11 with a copper bond-pad 20. The die 10 in FIG. 1 further includes passivation layers including a first dielectric layer 32 (e.g., silicon dioxide), a second dielectric layer 34 (e.g., silicon nitride), and a third dielectric layer 36 (e.g., polyimide). The die 10 further includes a cap 40 having a barrier layer 42 and a metal layer 44 over the barrier layer 42. The cap 40 is formed by constructing a first mask over the first and second dielectric layers 32 and 34, and etching holes through the first and second dielectric layers 32 and 34 over the bond-pad 20. The barrier layer 42 and the metal layer 44 are then deposited onto the workpiece 10. The process of forming the cap 40 further includes constructing a second mask on top of the metal layer 44 from a resist 50, developing the resist 50 to expose the areas of the metal layer 44 over the upper portions of the third dielectric layer 36, and then etching the metal layer 44 and the barrier layer 42 down to the third dielectric layer 36 using a reactive ion etch. The resist 50 is subsequently stripped from the workpiece 10 to leave the cap 40 over the copper bond-pad 20.

One problem with the copper interconnect structure illustrated in FIG. 1 is that it is relatively expensive to manufacture because this process requires a first mask to form the openings over the bond-pad 20 and a second mask to form the pattern of resist 50 over the metal layer 44. Masks are expensive to construct because they require very expensive photolithography equipment to achieve the required tolerances in semiconductor devices. This process is also expensive because it uses a costly reactive ion etch to remove portions of the metal layer 44 and the barrier layer 42. This process is even further expensive because the resist 50 pools over the bond-pad 20 and is time consuming to remove.

FIG. 2 is a cross-sectional view illustrating a portion of another embodiment of a microelectronic die 100 having a cap to protect a copper bond-pad. The die 100 illustrated in FIG. 2 is similar to the die 10 illustrated in FIG. 1, and thus like reference numbers refer to like components in both of these figures. The die 100 illustrated in FIG. 2 includes a cap 140 plated onto the bond-pad 20. The cap 140 is fabricated by constructing the first mask and forming a hole through the first and second dielectric layers 32 and 34 over the bond-pad 20. After forming the hole over the bond-pad 20, the cap 140 is plated onto the bond-pad 20 using a series of different plating cycles. For example, a palladium layer 142 can be plated directly onto the bond-pad 20 using a plating process. The palladium layer 142 provides a seed layer or nucleation layer for plating a nickel layer 144 onto the palladium layer 142 using another plating process. In some embodiments, a silver layer 146 can be plated onto the palladium layer 142 before depositing the nickel layer 144, and/or a gold layer 148 can be deposited onto the nickel layer 144.

One problem with the cap 140 illustrated in FIG. 2 is that the nickel initially plates onto one of the underlying metal layers and then continues to plate upon itself. The nickel, however, does not bond to the sidewalls of the opening through the dielectric layers such that oxygen and moisture can migrate along the interface between the nickel and the dielectric layers 32, 34 and 36. Therefore, the contact 140 does not sufficiently protect the copper bond-pad 20 from oxidation and corrosion.

DETAILED DESCRIPTION

1. Overview

Figure 1:
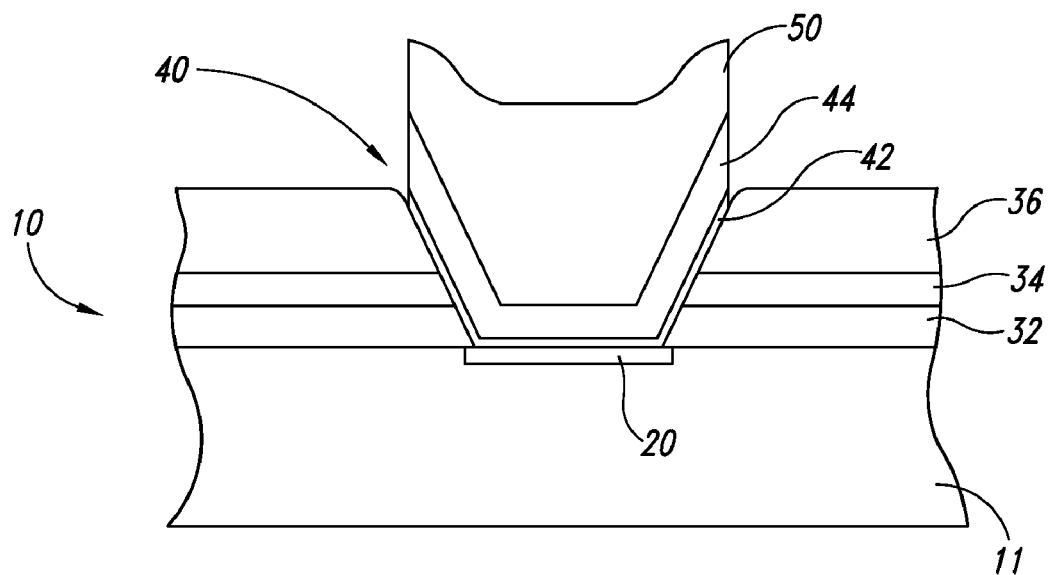
FIG. 1 is a cross-sectional view of a microelectronic device having a copper bond-pad in accordance with one aspect of the prior art.

Several aspects of the present invention are directed toward forming protective caps on bond-pads, such as bond-pads composed of copper, silver, gold or other suitable conductive materials. The protective caps provide sites to which conductive bumps, wire-bonds, metallization of redistribution layers, or balls may be attached in the manufacturing of microelectronic devices. One embodiment of a method for fabricating such bumps sites comprises providing a microelectronic workpiece having a plurality of dies that include integrated circuitry and bond-pads electrically coupled to the integrated circuitry. This embodiment further includes creating a passivation structure on the workpiece, forming openings in the passivation structure to expose portions of the bond-pads, and depositing an external metal layer over the passivation structure and the exposed portions of the bond-pads. The external metal layer generally has a thickness such that the openings are not completely filled by the metal layer. The process further includes planarizing the workpiece to an endpoint in the passivation structure. The planarization stage comprises placing the workpiece against a planarizing medium, and moving the workpiece and/or the planarizing medium relative to each other in a manner that removes portions of the external metal layer and the barrier layer from the passivation structure. As a result, the planarizing procedure electrically isolates remaining portions of the metal layer in the openings formed in the passivation structure to construct self-aligned protective caps over the bond-pads.

Another embodiment and method for fabricating bump sites on copper bond-pads includes providing a microelectronic workpiece having a plurality of dies that include integrated circuitry and bond-pads electrically coupled to the integrated circuitry. This embodiment further includes constructing a dielectric structure including openings through the dielectric structure. The openings have sidewalls arranged to at least partially expose the bond-pads and shoulders projecting transversely relative to the sidewalls. This embodiment further includes depositing a conductive layer over the dielectric structure and the exposed portions of the bond-pads such that the conductive layer has steps seated with the shoulders in the openings. The upper portions of the conductive layer are removed from the top of the dielectric structure to form self-aligned caps over the copper bond-pads. For example, the upper portions of the conductive layer can be removed from the dielectric structure by placing the workpiece against a planarizing medium, and moving the workpiece and/or the planarizing medium relative to each other. This process can optionally include forming an intermediate layer on the dielectric structure and the exposed portions of the bond-pads before depositing the conductive layer, and then depositing the conductive layer onto the intermediate layer. The intermediate layer, for example, can be (a) a barrier layer that prevents diffusion or migration of material between the bond-pads and the conductive layer, and/or (b) an adhesive layer that provides good adhesion to the dielectric structure and/or the bond-pads. The conductive layer can be aluminum, nickel or other suitable metals.

Another embodiment of a method for forming bump sites on copper bond-pads includes providing a microelectronic workpiece having a plurality of dies that include integrated circuitry and copper bond-pads electrically coupled to the integrated circuitry. This method further includes constructing a dielectric structure on the workpiece to have openings arranged in a pattern that at least partially exposes individual bond-pads. This method continues by forming a barrier layer on the dielectric structure and the exposed portions of the bond-pads, depositing an aluminum layer on the barrier layer, and coating the aluminum layer with a sacrificial material. The bump sites are further formed by removing upper portions of the sacrificial material, the aluminum layer, and the barrier layer using a mechanical or chemical-mechanical planarization process. The remaining portions of the sacrificial material can then be removed from the workpiece to expose the portions of the aluminum layer on the copper bond-pads.

Still another method for fabricating bump sites on bond-pads in accordance with the invention comprises providing a microelectronic workpiece having a plurality of dies that include integrated circuitry and bond-pads electrically coupled to the integrated circuitry. This embodiment further includes constructing a dielectric structure on the workpiece to have openings aligned with corresponding bond-pads and depositing a conductive cap layer over the dielectric structure and the bond-pads. The cap layer has a thickness less than that of the dielectric structure such that the openings in the dielectric structure are not completely filled by the cap layer. This method further includes removing portions of the cap layer from the workpiece without forming a mask over the cap layer to construct caps comprising discrete portions of at least the cap layer. The caps are self-aligned with corresponding copper bond-pads.

Another aspect of the invention is directed toward microelectronic workpieces that have bump sites over copper bond-pads. One embodiment of such a workpiece, for example, includes a substrate having a plurality of microelectronic dies comprising integrated circuitry and bond-pads electrically coupled to the integrated circuitry. The workpiece further includes (a) a dielectric structure having a plurality of openings with sidewalls projecting from corresponding bond-pads, and (b) a plurality of caps over corresponding bond-pads. The individual caps include a discrete portion of a conductive cap layer. The caps are electrically isolated from each other and self-aligned with corresponding bond-pads without forming a mask layer over the cap layer. The caps typically have a thickness less than that of the dielectric structure such that the openings in the dielectric structure are not completely filled by the caps.

Another embodiment of a microelectronic workpiece in accordance with the invention comprises a substrate having a plurality of microelectronic dies including integrated circuitry and bond-pads electrically coupled to the integrated circuitry. This embodiment further includes a dielectric structure on the workpiece and a plurality of conductive caps over the bond-pads. The dielectric structure has a planarized upper surface and a plurality of openings with sidewalls projecting from corresponding copper bond-pads. The individual conductive caps have a conductive layer in the openings. In one embodiment, the caps can include (a) a first layer attached to the bond-pads and the sidewalls of the openings, and (b) a second layer on the first layer. The second layer is typically aluminum or another suitably conductive material. The caps further include a planarized portion extending from the planarized upper surface of the dielectric structure. The workpiece can further include a plurality of external electrical connectors, such as conductive balls or wire-bonds, attached to the caps.

Another embodiment of a microelectronic workpiece in accordance with the invention includes a substrate having a plurality of microelectronic dies including integrated circuitry and copper bond-pads electrically coupled to the integrated circuitry. This embodiment further includes a dielectric structure on the workpiece and a plurality of conductive caps electrically isolated from each other and positioned over corresponding bond-pads. The dielectric structure in this embodiment includes a first dielectric layer on the workpiece, a second dielectric layer on the first dielectric layer, and a third dielectric layer on the second dielectric layer. The dielectric structure can further include a plurality of openings with sidewalls that are aligned with corresponding copper bond-pads. The individual openings have a lateral shoulder between the second and third dielectric layers or at another suitable location along the sidewalls. The conductive caps are positioned in corresponding openings over the bond-pads, and individual caps have a step engaged with a shoulder of a corresponding opening.

Several embodiments of the invention are described in the following sections with reference to copper bond-pads on a semiconductor device, but the methods and structures described below can be used for other types of microelectronic devices. The bond-pads, moreover, are not limited to copper bond-pads, but alternatively may be silver, gold or other suitable materials. Furthermore, other embodiments of the invention can have different configurations or components than those described herein. Several embodiments of the invention, therefore, may have additional elements or may not have some of the elements described below with reference to FIGS. 3-5C.

2. Embodiments of Self-Aligned Caps on Copper Bond-Pads

Figure 2:
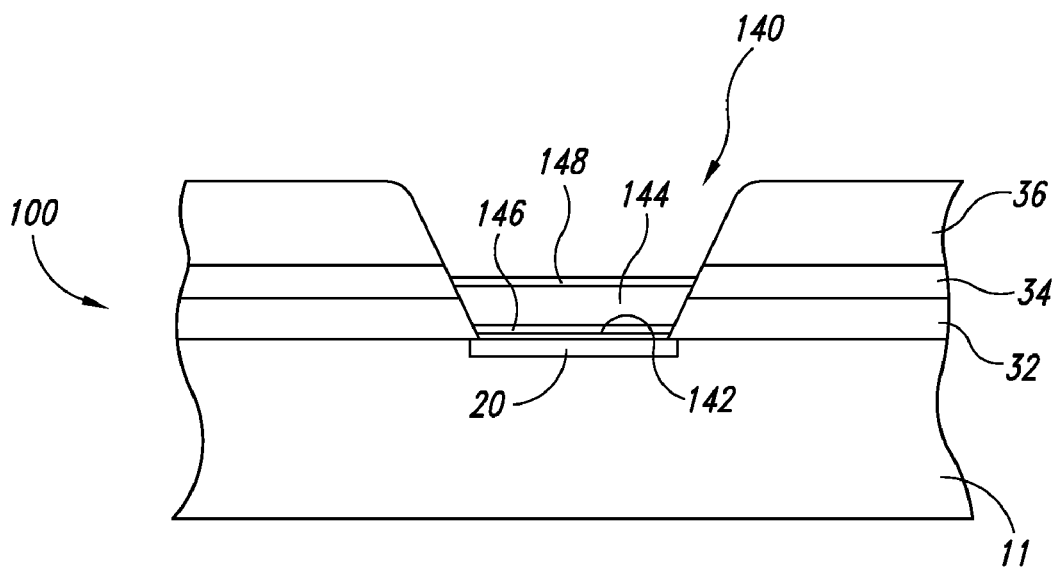
FIG. 2 is a cross-sectional view of a microelectronic device having a copper bond-pad in accordance with another aspect of the prior art.
Figure 3:
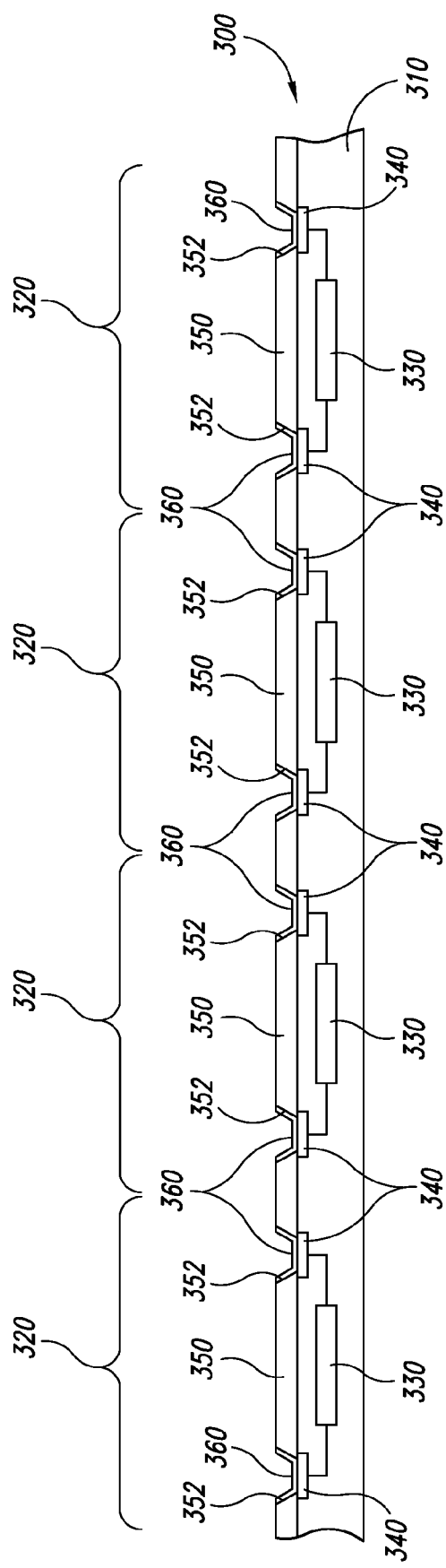
FIG. 3 is a cross-sectional view illustrating a portion of a microelectronic workpiece having a plurality of copper bond-pads and protective caps on the copper bond-pads in accordance with an embodiment of the invention.

FIG. 3 is a cross-sectional view illustrating a portion of a microelectronic workpiece 300 including a plurality of protective caps on bond-pads to provide contact sites for solder balls, wire-bonds, metallization of redistribution layers, or other externally exposed conductive connectors. The microelectronic workpiece 300 includes a substrate 310 having a plurality of dies 320 formed in and/or on the substrate 310. The dies 320 include integrated circuitry 330 and bond-pads 340 electrically coupled to the integrated circuitry 330. The bond-pads 340 are typically copper pads, but the bond-pads 340 can be silver pads, gold pads, or other suitably conductive pads. The workpiece 300 further includes a dielectric structure 350 having a plurality of openings 352 arranged in a pattern over the bond-pads 340. The openings 352, more specifically, are configured to expose at least a portion of individual bond-pads 340 that are to be coupled to an external device. The workpiece further includes a plurality of caps 360 that cover the bond-pads 340 and are attached to sidewalls of the openings 352. As explained in more detail below, the caps 360 are self-aligned with corresponding bond-pads 340 such that a separate mask is not used to electrically isolate the caps 360 in the openings 352. Compared to the conventional structures illustrated in FIGS. 1 and 2, the caps 360 are expected to (a) be much less expensive to fabricate, and (b) provide better protection against oxygen and moisture.

Figure 4A:
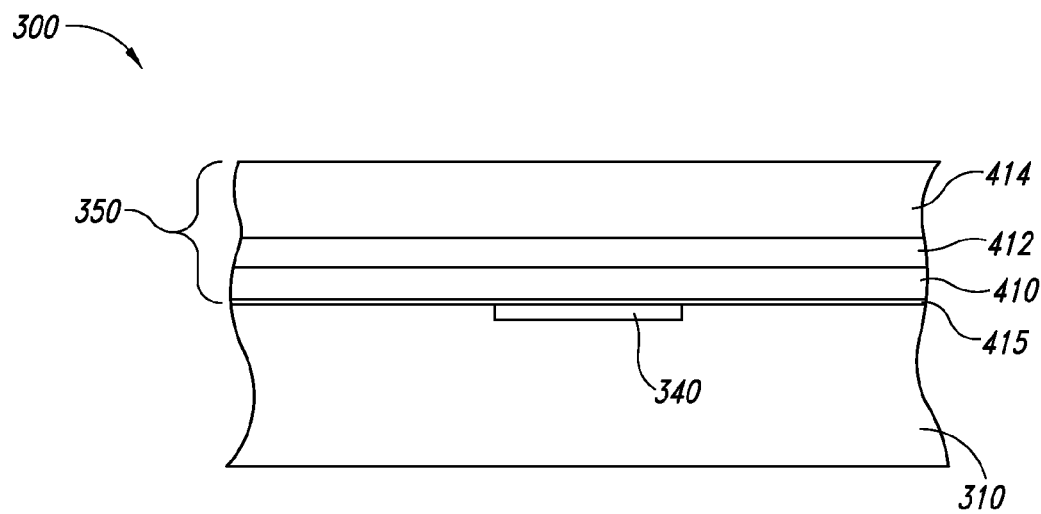
FIGS. 4A-4D are cross-sectional views illustrating stages of a process for fabricating a conductive cap over a copper bond-pad in accordance with one embodiment of the invention.

FIGS. 4A-4D are cross-sectional views illustrating the workpiece 300 at sequential stages of a process for fabricating one embodiment of the caps 360 shown in FIG. 3. Like reference numbers refer to like components in FIGS. 3-4D. FIG. 4A illustrates an early stage of this process in which the dielectric structure 350 has been deposited onto the substrate 310, but the bond-pad 340 has not yet been exposed through the dielectric structure 350. In this embodiment, the dielectric structure 350 includes a first dielectric layer 410, a second dielectric layer 412 on the first dielectric layer 410, and a third dielectric layer 414 on the second dielectric layer 412. The first dielectric layer 410 can be silicon dioxide and the second dielectric layer 412 can be silicon nitride. The first and second dielectric layers 410 and 412 can have a combined thickness of approximately 0.5 μm to 4 μm, and these layers typically have a total thickness of approximately 1 μm to 1.5 μm. The third dielectric layer 414 can be a polymer or other suitable dielectric material for forming a permanent mask on the second dielectric layer 412. The third dielectric layer 414, for example, can be a photo-active material deposited to a thickness of approximately 2-10 microns. One specific embodiment of the third dielectric layer 414 is a 4 micron thick layer of polybenzoxazole (PBO). As explained in more detail below, the third dielectric layer 414 is configured to inhibit dishing over the bond-pad 340 in a subsequent planarization procedure. The third dielectric layer 414, more specifically, is sufficiently thick to protect the bond-pad 340 and any metal layers over the bond-pad 340 from excessive erosion during a subsequent chemical-mechanical planarization stage. The workpiece 300 can further include a diffusion barrier 415 between the copper bond-pad 340 and the dielectric structure 350 to prevent copper from diffusing into the dielectric structure 350. In one embodiment, the diffusion barrier 415 is a 300 Å thick layer of silicon carbide. The dielectric layers 410, 412, 414 and 415 can all be deposited using suitable chemical vapor deposition, sputtering, or other known processes for depositing these materials.

Figure 4B:
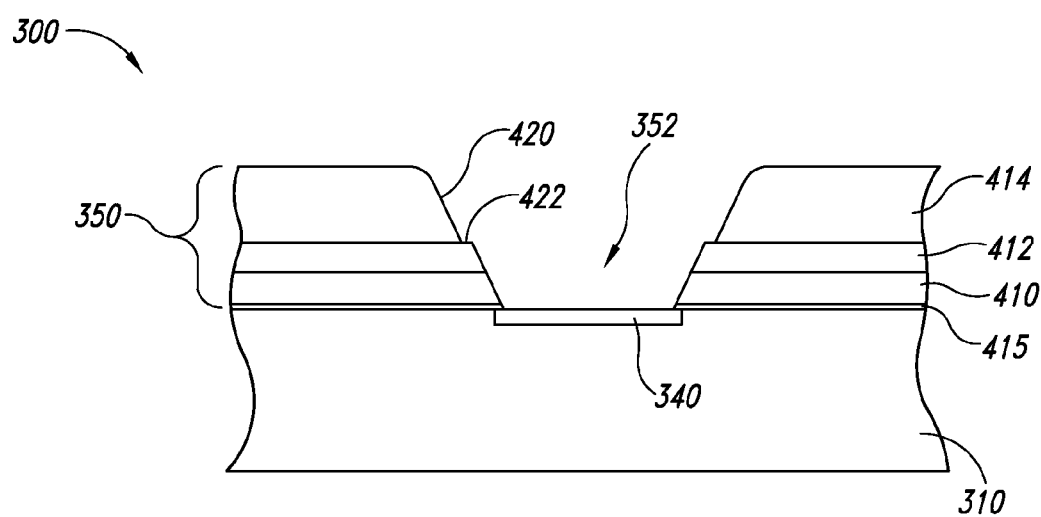

FIG. 4B illustrates a subsequent stage of the method in which an opening 352 has been formed through the dielectric structure 350 to expose a portion of the bond-pad 340. The opening 352 has a sidewall 420 and a shoulder 422 along the sidewall 420. The shoulder 422 can be a lateral notch or rim extending transversely with respect to the sidewall 420. The opening 352, for example, generally has a cross-sectional dimension parallel to the top surface of the bond-pad 340 of approximately 20 μm to 120 μm, and more generally 40 μm to 100 μm. In one embodiment, the third dielectric layer 414 is composed of PBO and the opening 352 is formed by exposing and developing the PBO to create a mask having a hole aligned with the bond-pad 340. The portions of the second dielectric layer 412, first dielectric layer 410 and the diffusion barrier 415 over the bond-pad 340 are then etched to expose the upper surface of the bond-pad 340. After etching the opening 352, the workpiece 300 is cleaned using a light plasma clean-up. The plasma clean-up also erodes the third dielectric layer 414 to further form the shoulder 422 at the interface between the second dielectric layer 412 and the third dielectric layer 414.

Figure 4C:
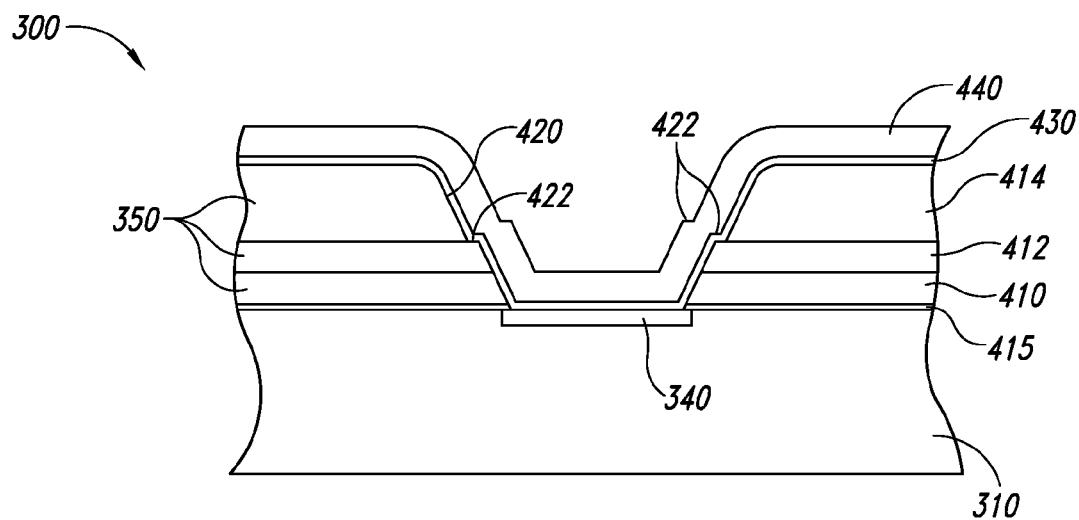

FIG. 4C illustrates the workpiece 300 at a subsequent stage after which conductive materials for the cap have been deposited onto the workpiece. In one embodiment, the workpiece 300 includes a first conductive layer 430 deposited onto the dielectric structure 350 and the bond-pad 340, and a second conductive layer 440 deposited onto the first conductive layer 430. The first conductive layer 430, for example, can be an optional intermediate layer that provides (a) a barrier to prevent migration or diffusion of materials between the bond-pad 340 and the second conductive layer 440, and/or (b) adheres well to dielectric structure 350 and the bond-pads 340. In the case of copper bond-pads, the first conductive layer 430 is typically a barrier/adhesion layer having a thickness of approximately 300 Å to 500 Å, and the second conductive layer 440 is typically a metal layer having a thickness of approximately 5,000 Å to 30,000 Å. The first conductive layer 430 can be composed of Ta, TaN, TiN, $WN_x$, or other suitable materials that prevent copper from diffusing into the dielectric structure 350 and/or the second conductive layer 440. The second conductive layer 440 can be an aluminum layer having a thickness of approximately 8,000 Å to 20,000 Å. The second conductive layer 440 can alternatively be nickel or another suitable metal. In the case of a nickel second conductive layer 440, the first conductive layer 430 in not needed because copper does not diffuse into nickel. The first and second conductive layers 430 and 440 conform to the sidewall 420 and the shoulder 422. As a result, the first and second conductive layers 430 and 440 have a step 442 seated with the shoulder 422. The interface between the step 442 and the shoulder 422 provides a strong barrier to block oxygen and moisture from reaching the bond-pad 340. The first and second conductive layers 430 and 440 also have a combined thickness less than that of the dielectric structure 350 such that these conductive layers do not completely fill the opening 352 in the dielectric structure 350. In one embodiment, the combined thickness of the first and second conductive layers 430 and 440 is approximately 1 µm to 3 µm such that a significant void without conductive material exists in the opening 352 immediately after depositing the conductive layers.

Figure 4D:
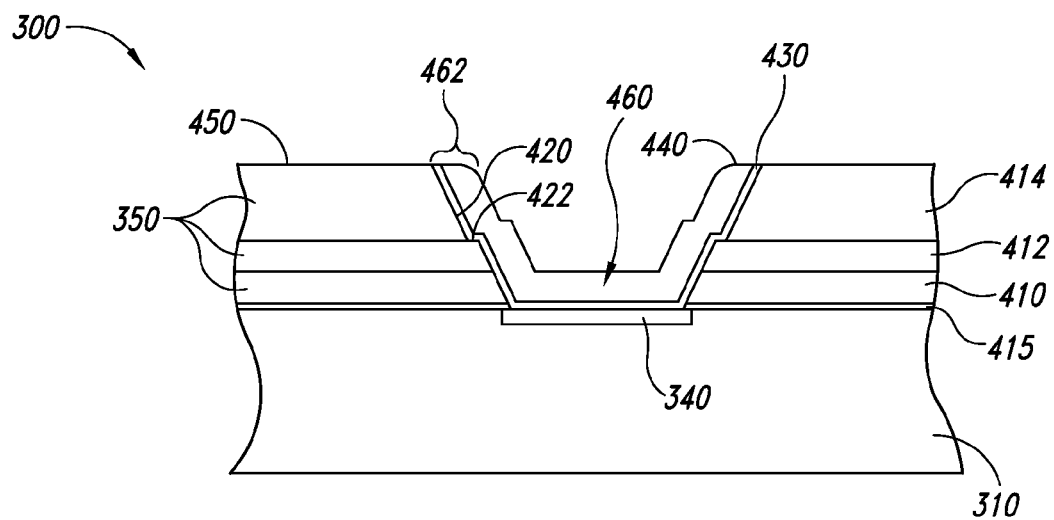

FIG. 4D illustrates the workpiece 300 after a cap 460 has been formed over the bond-pad 340. The cap 460 is an embodiment of one of the caps 360 shown in FIG. 3. The cap 460 is formed by planarizing the workpiece 300 to remove the upper portions of the first and second conductive layers 430 and 440 from the top surface of the third dielectric layer 414. The workpiece 300 can be planarized by placing the workpiece 300 against a planarizing medium (not shown), and moving the workpiece and/or the planarizing medium relative to each other. The planarization process removes the upper portions of the first and second conductive layers 430 and 440 from the top surface of the third dielectric layer 414 without excessively eroding the portion of the first and second conductive layers 430 and 440 over the bond-pad 340. The third dielectric layer 414 protects the portion of the first and second conductive layers 430 and 440 over the bond-pad 340 because the relatively large thickness of the third dielectric layer 414 prevents the polishing pad from projecting into the opening to the extent that it causes unacceptable "dishing" in the second conductive layer 440. Although no dishing is shown in the portion of the second conductive layer 440 over the bond-pad 340, some dishing may be acceptable. As shown in FIG. 4D, the third dielectric layer 414 has a planarized upper surface 450 and the cap 460 has a planarized portion 462 that is an extension of the planarized upper surface 450. The planarizing process electrically isolates the cap 460 on the bond-pad 340 without having to form a second mask over the second conductive layer 440. The cap 460, therefore, is self-aligned with the bond-pad 340.

One aspect of the cap 460 illustrated in FIG. 4D is it is expected to be less expensive to produce than the cap 40 illustrated and described above with reference to FIG. 1. The cap 460 is manufactured using only a single mask to form the openings 352 through the dielectric structure 350. The caps 460 are self-aligned with the bond-pads 340 because the planarizing procedure described with reference to FIG. 4D removes the upper portions of the first and second conductive layers 430 and 440 from the top surface of the dielectric structure 350 without using a second mask. In contrast to the cap 460 illustrated in FIG. 4D, the cap 40 illustrated in FIG. 1 requires a first mask to form the opening through the dielectric layers and a second mask to pattern the resist 50. Moreover, the cap 40 illustrated in FIG. 1 requires an expensive reactive ion etch to remove the exposed portions of the conductive layers, and the resist 50 must be stripped from the cap 40. The single planarizing process used to form the cap 460 is much less expensive than forming a second mask on the workpiece, etching the metal layers using a reactive ion etch, and cleaning the resist. Therefore, the cap 460 illustrated in FIG. 4D is expected to be cost effective to produce.

The embodiment of the cap 460 illustrated in FIG. 4D is further expected to provide exceptionally good protection of the copper bond-pad 40. First, the first conductive layer 430 bonds or otherwise adheres to the sidewall 420, and the second conductive layer 440 bonds to the first conductive layer 430. Second, the length of the interface between the cap 460 and the dielectric structure 350 is relatively long. As a result, oxygen and moisture are less likely to reach the surface of the copper bond-pad 340. Third, the interface between the shoulder 422 and the step 442 further inhibits air and moisture from reaching the copper bond-pad 340. The second conductive layer 440 typically has a higher coefficient of thermal expansion than the dielectric structure 350. As a result, when the second conductive layer 440 cools after it has been deposited, it contracts inwardly and downwardly to a greater extent than the dielectric structure 350 contracts such that the step 442 presses downward against the shoulder 422. The second conductive layer 440 effectively forms a seal between the step 442 and the shoulder 422 to further inhibit oxygen, moisture or other contaminants from reaching the bond-pad 340.

Another aspect of the cap 460 is that the dielectric structure enables the use of chemical-mechanical planarization to remove the upper portions of the first and second conductive layers 430 and 440 without a mask. Before the present invention, chemical-mechanical planarization was not thought to be a viable option for removing the upper portions of the first and second conductive layers 430 and 440 because the polishing pad would project into the openings and cause dishing in the caps. The embodiment of the process illustrated in FIGS. 4A-4D enables the use of chemical-mechanical planarization by configuring the dielectric structure 350 to prevent or at least mitigate dishing of the second conductive layer 440 in the region over the bond-pad 340. For example, one particular embodiment of the procedure illustrated in FIGS. 4A-4D forms the third dielectric layer 414 to a thickness of approximately 4 microns so that the planarizing pad does not "dish" into the second conductive layer 440 to an unacceptable extent before the upper portions of the first and second conductive layers 430 and 440 have been removed from the third dielectric layer 414.

Figure 5A:
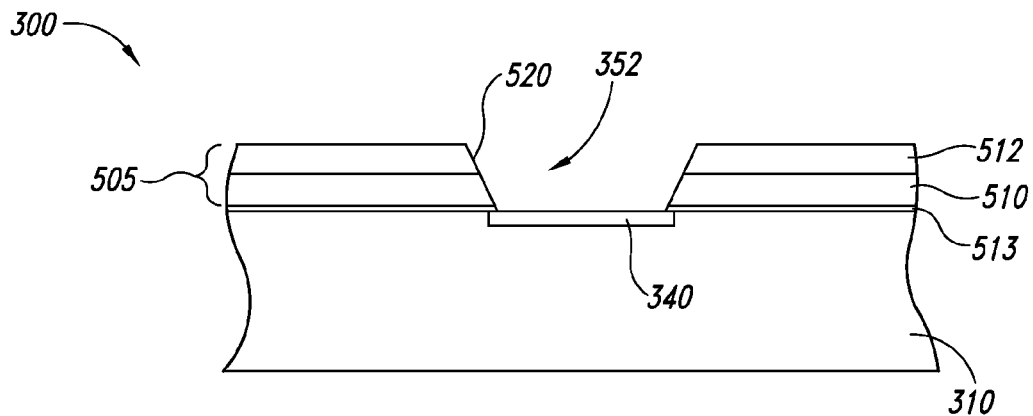
FIGS. 5A-5C are cross-sectional views illustrating stages of a process for fabricating a conductive cap over a copper bond-pad in accordance with another embodiment of the invention.
Figure 5B:
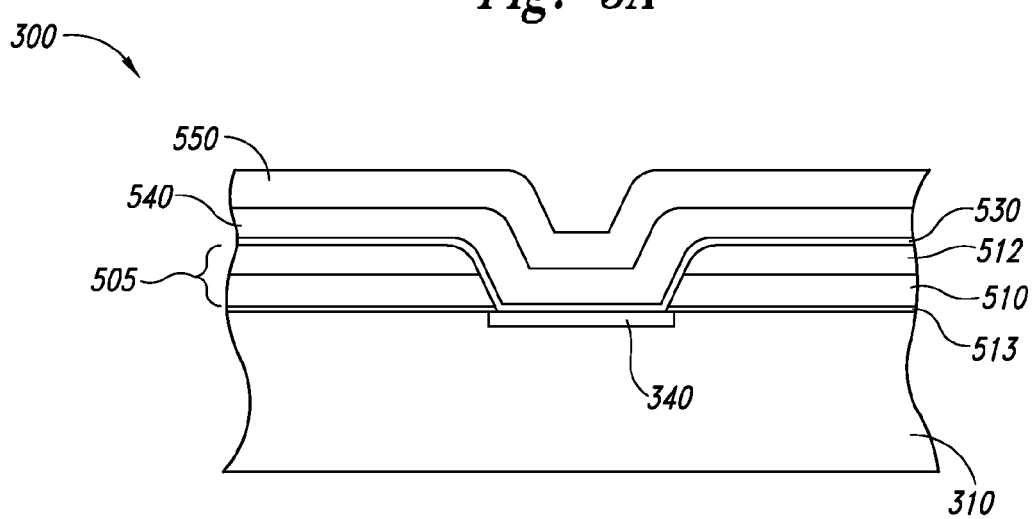
Figure 5C:
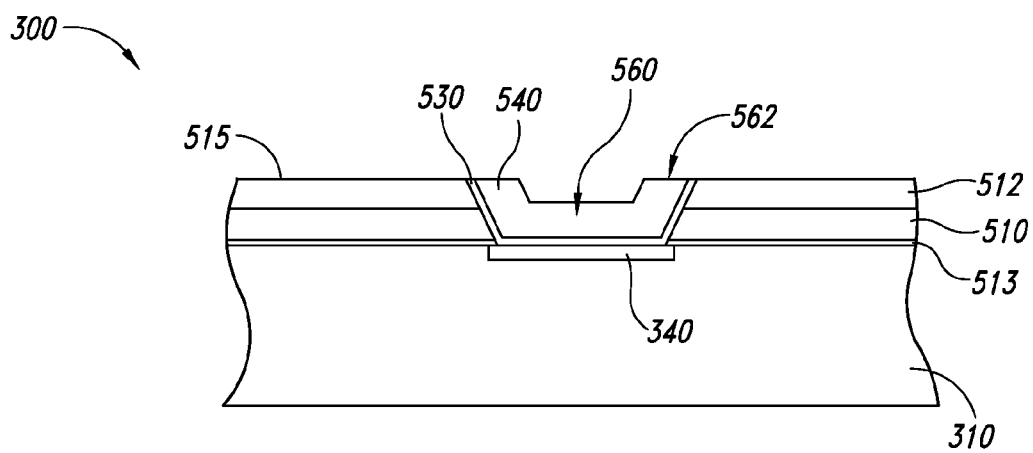

FIGS. 5A-5C illustrate a method for forming a cap defining another embodiment of one of the caps 360 illustrated in FIG. 3. Like reference numbers refer to like components in FIGS. 3-5C. FIG. 5A illustrates an early stage of this embodiment in which the workpiece 300 has a dielectric structure 505 including a first dielectric layer 510 and a second dielectric layer 512. The first dielectric layer 510 can be silicon dioxide, and the second dielectric layer 512 can be silicon nitride. The workpiece 300 can further include a barrier layer 513 between the copper bond-pad 340 and the dielectric structure 505 to prevent copper from diffusing into the dielectric structure 505. The dielectric 505 further includes an opening 352 having a sidewall 520 projecting from the bond-pad 340. The first and second dielectric layers 510 and 512 can be deposited onto the substrate 310, and then the opening 352 can be etched through the first and second dielectric layers 510 and 512 using a mask. The mask is then stripped from the workpiece 300.

FIG. 5B illustrates the workpiece 300 at a subsequent stage of the method. At this stage, the workpiece includes a first conductive layer 530 deposited onto the second dielectric layer 512 and the bond-pad 340. The workpiece further includes a second conductive layer 540 deposited onto the first conductive layer 530, and a sacrificial material 550 deposited onto the second conductive layer 540. The first conductive layer 530 can be a barrier layer, the second conductive layer 540 can be aluminum or another suitable metal, and the sacrificial material 550 can be a resist. The structure and compositions of the first and second conductive layers 530 and 540 can be the same as the first and second conductive layers 430 and 440 described above with reference to FIGS. 4A-D.

FIG. 5C illustrates the workpiece 300 after the upper portions of the first and second conductive layers 530 and 540 have been removed using a planarization process to form a cap 560 over the bond-pad 340. In this embodiment, the upper portions of the first and second conductive layers 530 and 540 are removed from the workpiece 300 by pressing the workpiece 300 against a planarizing medium, and moving the workpiece and/or the planarizing medium relative to each other in a chemical-mechanical planarization process. As a result, the second dielectric layer 512 has a planarized surface 515 and the cap 560 has a planarized portion 562.

From the foregoing, it will be appreciated that specific embodiments of the invention have been described herein for purposes of illustration, but that various modifications may be made without deviating from the spirit and scope of the invention. For example, the planarizing processes described above with reference to FIGS. 4D and 5C can be purely a mechanical process or a chemical-mechanical process. The bond-pads, conductive layers and dielectric layers, moreover, can be composed of different materials and/or have different thicknesses than those described above. Additionally, a redistribution structure can be fabricated on top of the dielectric structure and caps such that the metallization in the redistribution structures is electrically coupled to the caps over the bond-pads. Accordingly, the invention is not limited except as by the appended claims.

We claim:

1. A method of forming bump sites on bond-pads in the manufacturing of microelectronic devices, the method comprising:
    depositing a first dielectric layer over a microelectronic workpiece, the workpiece including a plurality of dies each having integrated circuitry and at least one bond-pad electrically coupled to the integrated circuitry;
    depositing a photo-active second dielectric layer onto the first dielectric layer;
    developing the photo-active second dielectric layer to form a mask having holes aligned with corresponding bond-pads;
    etching through the first dielectric layer using the mask to form openings at least partially exposing the bond-pads;
    depositing an external metal layer over the second dielectric layer and the bond-pads; and
    planarizing the workpiece to remove portions of the external metal layer to leave self-aligned caps over the bond-pads.

2. The method of claim 1 wherein the photo-active second dielectric layer is a PBO.

3. The method of claim 1 wherein the second dielectric layer is a polyimide.

4. The method of claim 1 wherein etching through the first and second dielectric layers to form openings includes forming openings having sidewalls projecting from corresponding bond-pads and forming shoulders in the openings extending transversely to the sidewalls.

5. The method of claim 1 wherein depositing the external metal layer comprises depositing the external metal layer to a thickness less than a thickness of the combined first and second dielectric layers.

6. The method of claim 1 wherein the bond-pads are copper and the method further comprises depositing a diffusion barrier layer onto the bond-pads before depositing the external metal layer, wherein the diffusion barrier layer at least partially inhibits copper from diffusing into the external metal layer.

7. The method of claim 6 wherein the diffusion barrier layer is composed of at least one of tantalum, titanium and tungsten.

8. The method of claim 1, further comprising depositing a sacrificial material onto the external metal layer before planarizing the workpiece and stripping remaining portions of the sacrificial material after planarizing the workpiece.

9. A method of forming bump sites on bond-pads in the manufacturing of microelectronic devices, the method comprising:
    providing a microelectronic workpiece having a plurality of dies, wherein individual dies include integrated circuitry and bond-pads electrically coupled to the integrated circuitry;
    constructing a passivation structure having openings aligned with corresponding bond-pads, wherein constructing the passivation structure includes:
        depositing a first dielectric layer over the workpiece, depositing a second dielectric layer onto the first dielectric layer, and depositing a photoactive polyimide layer onto the second dielectric layer;
        developing the photoactive polyimide layer to form a mask having holes aligned with corresponding bond-pads; and
        etching using the mask through the first and second dielectric layers to form the openings, wherein the openings at least partially expose the bond-pads;
    depositing a metal layer over the photoactive polyimide layer and the bond-pads; and
    removing portions of the metal layer from upper portions of the passivation structure to form self-aligned caps over the bond-pads, wherein removing portions of the metal layer includes placing the workpiece against a planarizing medium and moving at least one of the workpiece or planarizing medium relative to the other.

10. The method of claim 9 wherein the openings include sidewalls and shoulders, the sidewalls projecting from corresponding bond-pads and extending through the first and second dielectric layers and the shoulders projecting transversely relative to the sidewalls.

11. The method of claim 9 wherein the passivation structure has a thickness configured to prevent dishing through the portions of the metal layer over the bond-pads during the step of removing portions of the metal layer from upper portions of the passivation structure.

12. The method of claim 9, further comprising depositing an intermediate layer onto the photoactive polyimide layer before depositing the metal layer, and wherein depositing the metal layer includes depositing the metal layer over the intermediate layer, and removing corresponding portions of the intermediate layer with the metal layer from the upper portions of the passivation structure.

13. The method of claim 9 wherein the bond-pads comprise one or more of copper, silver and gold.

14. A method of forming bump sites on bond-pads in the manufacturing of microelectronic devices, the method comprising:
    providing a microelectronic workpiece having a plurality of dies, wherein individual dies include integrated circuitry and bond-pads electrically coupled to the integrated circuitry;
    forming a dielectric structure on the workpiece by depositing a first dielectric layer over the workpiece and depositing a photo-active patterning layer over the first dielectric layer;
    developing the photo-active patterning layer to form a mask having holes aligned with corresponding bond-pads;
    etching using the mask through the first dielectric layer to form openings aligned with corresponding bond-pads and at least partially exposing the bond-pads, the openings having sidewalls extending from the bond-pads and shoulders projecting transversely relative to the sidewalls;

depositing an external metal layer over the photoactive patterning layer and the bond pads; and removing portions of the external metal layer from the dielectric structure to form self-aligned caps over the bond-pads.

15. The method of claim 14 wherein forming the dielectric structure further comprises depositing a second dielectric layer onto the first dielectric layer and depositing the photoactive patterning layer onto the second dielectric layer, and wherein etching using the mask includes etching through the second dielectric layer.

16. The method of claim 14 wherein the photoactive patterning layer comprises one or more of a PBO and a polyimide.

17. The method of claim 14 wherein the bond-pads are composed of copper, the method further comprising depositing an intermediate layer onto the bond-pads before depositing the external metal layer, the intermediate layer at least partially inhibiting copper from diffusing into the external metal layer.

18. The method of claim 14 wherein removing portions of the external metal layer includes exposing an upper surface of the dielectric structure.

19. The method of claim 14 wherein removing portions of the external metal layer comprises removing portions of the external metal layer without a mask by chemical mechanical planarization of portions of the external metal layer.

20. The method of claim 19 wherein the dielectric structure has a thickness configured to at least partially prevent dishing into portions of corresponding bond-pads during the planarization.

* * * * *

UNITED STATES PATENT AND TRADEMARK OFFICE
CERTIFICATE OF CORRECTION

PATENT NO.         : 7,528,064 B2
APPLICATION NO. : 11/872607
DATED                 : May 5, 2009
INVENTOR(S)       : Tang et al.

Page 1 of 1

It is certified that error appears in the above-identified patent and that said Letters Patent is hereby corrected as shown below:

In column 1, line 5, delete "REFERANCE" and insert -- REFERENCE --, therefor.

Signed and Sealed this

Eleventh Day of August, 2009

David J. Kappos
*Director of the United States Patent and Trademark Office*